(12) United States Patent
Wakioka et al.

(10) Patent No.: US 11,421,107 B2
(45) Date of Patent: Aug. 23, 2022

(54) CURABLE RESIN COMPOSITION, CURED PRODUCT, ADHESIVE, BONDING FILM, COVERLAY FILM, FLEXIBLE COPPER-CLAD LAMINATE AND CIRCUIT BOARD

(71) Applicant: SEKISUI CHEMICAL CO., LTD., Osaka (JP)

(72) Inventors: Sayaka Wakioka, Osaka (JP); Kohei Takeda, Osaka (JP); Yuta Oatari, Osaka (JP); Takashi Shinjo, Osaka (JP); Masami Shindo, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 352 days.

(21) Appl. No.: 16/492,361

(22) PCT Filed: Jan. 26, 2018

(86) PCT No.: PCT/JP2018/002368
§ 371 (c)(1),
(2) Date: Sep. 9, 2019

(87) PCT Pub. No.: WO2018/139559
PCT Pub. Date: Aug. 2, 2018

(65) Prior Publication Data
US 2021/0130614 A1    May 6, 2021

(30) Foreign Application Priority Data

Jan. 27, 2017 (JP) ............... JP2017-013558
Jan. 26, 2018 (JP) ............... JP2018-011019
Jan. 26, 2018 (JP) ............... JP2018-011020

(51) Int. Cl.
| | | |
|---|---|---|
| C08L 79/08 | (2006.01) | |
| B32B 7/12 | (2006.01) | |
| B32B 15/092 | (2006.01) | |
| C09J 179/08 | (2006.01) | |
| B32B 27/28 | (2006.01) | |

(Continued)

(52) U.S. Cl.
CPC .............. *C08L 79/08* (2013.01); *B32B 7/12* (2013.01); *B32B 15/08* (2013.01); *B32B 15/092* (2013.01); *B32B 15/20* (2013.01); *B32B 27/281* (2013.01); *C09J 179/08* (2013.01); *B32B 2457/08* (2013.01); *Y10T 428/31681* (2015.04); *Y10T 428/31721* (2015.04)

(58) Field of Classification Search
CPC .......... C08L 79/08; C08L 63/00; B32B 15/08; B32B 27/281; B32B 7/12; B32B 15/092; B32B 15/20; B32B 2457/08; B32B 27/36; B32B 15/09; B32B 27/08; B32B 2307/748; B32B 2255/10; B32B 2457/14; B32B 2405/00; B32B 2250/02; B32B 2553/00; B32B 2255/26; B32B 2307/732; B32B 2307/30; B32B 2457/202; B32B 2307/546; B32B 2605/18; B32B 2307/306; C09J 179/08; C09J 7/30; C09J 2203/326; C09J 2479/08; C09J 135/00; C09J 163/00; C09J 7/00; Y10T 428/31681; Y10T 428/31721; H05K 1/0393; H05K 2201/0154; H05K 1/0326; H05K 1/0353; C08G 73/10; C08G 59/4042; C08G 73/1046; C08J 5/18
See application file for complete search history.

(56) References Cited

U.S. PATENT DOCUMENTS

| | | |
|---|---|---|
| 5,147,943 A | 9/1992 | Inoue et al. |
| 5,891,367 A | 4/1999 | Basheer et al. |
| 2007/0074896 A1 | 4/2007 | Tanaka et al. |

(Continued)

FOREIGN PATENT DOCUMENTS

| | | |
|---|---|---|
| EP | 1 918 341 | 5/2008 |
| JP | 61-270852 | 12/1986 |

(Continued)

OTHER PUBLICATIONS

International Search Report and International Preliminary Report on Patentability dated Mar. 20, 2018 in International (PCT) Application No. PCT/JP2018/002367.

(Continued)

*Primary Examiner* — John D Freeman
(74) *Attorney, Agent, or Firm* — Wenderoth, Lind & Ponack, LLP.

(57) ABSTRACT

The present invention aims to provide a curable resin composition capable of providing a cured product that has a high glass transition temperature after curing and is excellent in thermal decomposition resistance, adhesiveness, and long-term heat resistance. The present invention also aims to provide a cured product of the curable resin composition, an adhesive containing the curable resin composition, and an adhesive film, a coverlay film, a flexible copper clad laminate, and a circuit board each formed using the curable resin composition. Provided is a curable resin composition containing: a curable resin; an imide oligomer having an imide skeleton in a main chain and a crosslinkable functional group at an end and having a number average molecular weight of 4,000 or less; and a curing accelerator, a cured product of the curable resin composition having an initial adhesive force to polyimide of 3.4 N/cm or more, the cured product after storage at 200° C. for 100 hours having an adhesive force to polyimide of at least 0.8 times the initial adhesive force.

20 Claims, No Drawings

(51) Int. Cl.
    *B32B 15/20*    (2006.01)
    *B32B 15/08*    (2006.01)

(56) References Cited

U.S. PATENT DOCUMENTS

2008/0058476 A1* 3/2008 Whiteker .............. C08L 79/08
    525/418
2012/0059119 A1   3/2012  Bito et al.

FOREIGN PATENT DOCUMENTS

| | | |
|---|---|---|
| JP | 02-191623 | 7/1990 |
| JP | 7-224269 | 8/1995 |
| JP | 2001-316469 | 11/2001 |
| JP | 2004-502859 | 1/2004 |
| JP | 2004-323728 | 11/2004 |
| JP | 2007-091799 | 4/2007 |
| JP | 2008-063298 | 3/2008 |
| JP | 2008-255249 | 10/2008 |
| JP | 2009-258367 | 11/2009 |
| JP | 2010-001352 | 1/2010 |
| JP | 2011-42730 | 3/2011 |
| JP | 2011-222810 | 11/2011 |
| JP | 2012-1701 | 1/2012 |
| JP | 2012-097206 | 5/2012 |
| JP | 2015-117278 | 6/2015 |
| JP | 2016-020437 | 2/2016 |
| JP | 2016-41797 | 3/2016 |
| JP | 2016-069651 | 5/2016 |
| JP | 2016-147946 | 8/2016 |
| WO | 02/04572 | 1/2002 |
| WO | 2005/100433 | 10/2005 |
| WO | 2008/032669 | 3/2008 |
| WO | 2010/128667 | 11/2010 |
| WO | 2016/171101 | 10/2016 |

OTHER PUBLICATIONS

International Search Report and International Preliminary Report on Patentability dated May 1, 2018 in International (PCT) Application No. PCT/JP2018/002368.

Extended European Search Report dated Nov. 24, 2021, in European Application No. 19777376.5.

International Search Report dated May 21, 2019 in International (PCT) Application No. PCT/JP2019/010905.

* cited by examiner

CURABLE RESIN COMPOSITION, CURED PRODUCT, ADHESIVE, BONDING FILM, COVERLAY FILM, FLEXIBLE COPPER-CLAD LAMINATE AND CIRCUIT BOARD

TECHNICAL FIELD

The present invention relates to a curable resin composition capable of providing a cured product that has a high glass transition temperature after curing and is excellent in thermal decomposition resistance, adhesiveness, and long-term heat resistance. The present invention also relates to a cured product of the curable resin composition, an adhesive containing the curable resin composition, and an adhesive film, a coverlay film, a flexible copper clad laminate, and a circuit board each formed using the curable resin composition.

BACKGROUND ART

Curable resins such as epoxy resins have low shrinkage and have excellent adhesiveness, insulation, and chemical resistance. Such curable resins are used in many industrial products. In particular, curable resin compositions that provide good results in a solder reflow test concerning short-time heat resistance or in a thermal cycle test concerning repeated heat resistance are frequently used in electronic device applications.

In recent years, in-vehicle electronic control units (ECUs), power devices containing SiC or GaN, and the like have attracted attention. Curable resin compositions used in these applications are required to have heat resistance when continuously exposed to high temperature for a long time (long-term heat resistance), rather than short-time or repeated heat resistance.

Patent Literature 1 discloses an imide oligomer curing agent having an acid anhydride structure at both ends as a curing agent used for curable resin compositions. However, such a curing agent has insufficient compatibility with curable resins such as epoxy resins, so that the resulting curable resin composition has poor long-term heat resistance.

Patent Literatures 2 and 3 disclose curable resin compositions containing, as a curing agent, a polyimide in which a flexible siloxane skeleton or alicyclic skeleton is introduced to improve the compatibility with curable resins.

Introducing a siloxane skeleton or an alicyclic skeleton, however, tends to reduce the glass transition temperature of the resulting cured product, leading to poor mechanical strength or long-term heat resistance at the operation temperature of ECUs, power devices, or the like.

Patent Literature 4 discloses an imide oligomer which is formed using an acid dianhydride having a specific structure and which has phenolic hydroxy groups or aniline amino groups at both ends. However, from the standpoint of the solubility in a solvent, the use of such an imide oligomer requires the use of a high polar solvent, which may cause poor storage stability or insufficient solubility in curable resins. The imide oligomer thus may fail to be taken in the cured product and become residue to reduce the long-term heat resistance.

CITATION LIST

Patent Literature

Patent Literature 1: JP S61-270852 A
Patent Literature 2: JP 2016-20437 A
Patent Literature 3: JP 2016-69651 A
Patent Literature 4: WO 2005/100433

SUMMARY OF INVENTION

Technical Problem

The present invention relates to a curable resin composition capable of providing a cured product that has a high glass transition temperature after curing and is excellent in thermal decomposition resistance, adhesiveness, and long-term heat resistance. The present invention also aims to provide a cured product of the curable resin composition, an adhesive containing the curable resin composition, and an adhesive film, a coverlay film, a flexible copper clad laminate, and a circuit board each formed using the curable resin composition.

Solution to Problem

A first aspect of the present invention is a curable resin composition containing: a curable resin; an imide oligomer having an imide skeleton in a main chain and a crosslinkable functional group at an end and having a number average molecular weight of 4,000 or less; and a curing accelerator, a cured product of the curable resin composition having an initial adhesive force to polyimide of 3.4 N/cm or more, the cured product after storage at 200° C. for 100 hours having an adhesive force to polyimide of at least 0.8 times the initial adhesive force.

A second aspect of the present invention is a curable resin composition containing: a curable resin; and a curing agent, the curable resin composition having a tack value at 60° C. of at least 2 times the tack value at 25° C., a cured product of the curable resin composition having an initial adhesive force to polyimide of 3.4 N/cm or more, the cured product after storage at 200° C. for 100 hours having an adhesive force to polyimide of at least 0.8 times the initial adhesive force.

A third aspect of the present invention is a curable resin composition containing: a curable resin; and a curing agent, the curable resin composition having a surface free energy of 40 mJ/m$^2$ or more, a cured product of the curable resin composition having an initial adhesive force to polyimide of 3.4 N/cm or more, the cured product after storage at 200° C. for 100 hours having an adhesive force to polyimide of at least 0.8 times the initial adhesive force.

A fourth aspect of the present invention is a curable resin composition containing: a curable resin; and a curing agent, a cured product of the curable resin composition having an initial adhesive force to polyimide of 3.4 N/cm or more, the cured product after storage at 200° C. for 100 hours having an adhesive force to polyimide of at least 0.8 times the initial adhesive force, the cured product after storage in an environment at 85° C. and 85% RH for 24 hours having an adhesive force to polyimide of at least 0.8 times the initial adhesive force.

The present invention is described in detail below. The curable resin compositions of the first to fourth aspects of the present invention may be referred to as "the curable resin composition of the present invention" in the descriptions of matters common to these curable resin compositions.

The present inventors examined a case where an imide oligomer having a specific structure and a number average molecular weight equal to or less than a specific value is used as the curing agent of the curable resin composition, the initial adhesive force of the cured product to polyimide is set to a value equal to or more than a specific value, and the ratio of the adhesive force of the cured product to polyimide after storage at 200° C. for 100 hours to the initial adhesive force is set to a value equal to or more than a specific value.

Furthermore, the present inventors examined a case where the initial adhesive force of the cured product to polyimide is set to a value equal to or more than a specific value, the ratio of the adhesive force of the cured product to polyimide after storage at 200° C. for 100 hours to the initial adhesive force is set to a value equal to or more than a specific value, and the ratio of the tack value at 60° C. to the tack value at 25° C. is set to a value equal to or greater than a specific value.

Furthermore, the present inventors examined a case where the initial adhesive force of the cured product to polyimide is set to a value equal to or more than a specific value, the ratio of the adhesive force of the cured product to polyimide after storage at 200° C. for 100 hours to the initial adhesive force is set to a value equal to or more than a specific value, and the surface free energy is set to a value equal to or more than a specific value.

Furthermore, the present inventors examined a case where the initial adhesive force of the cured product to polyimide is set to a value equal to or more than a specific value, the ratio of the adhesive force of the cured product to polyimide after storage at 200° C. for 100 hours to the initial adhesive force is set to a value equal to or more than a specific value, and the adhesive force of the cured product to polyimide after storage in an environment at 85° C. and 85% RH for 24 hours is set to a value equal to or more than a specific value.

As a result, the inventors found out that it is possible to produce a cured product that has a high glass transition temperature after curing and is excellent in thermal decomposition resistance, adhesiveness, and long-term heat resistance. The inventors thus completed the present invention.

A cured product of the curable resin composition of the present invention has an initial adhesive force to polyimide of 3.4 N/cm or more. With the cured product having an initial adhesive force to polyimide of 3.4 N/cm or more, the curable resin composition of the present invention can be suitably used in, for example, adhesives for coverlays of flexible print circuit boards. The initial adhesive force of the cured product to polyimide is preferably 5 N/cm or more, more preferably 6 N/cm or more.

The initial adhesive force to polyimide can be measured by a T-peel test of a specimen having a width of 1 cm using a tensile tester under the conditions of 25° C. and a peeling speed of 20 mm/min. The specimen is obtained by stacking polyimide films each having a thickness of 50 μm on both surfaces of a curable resin composition film having a thickness of 20 μm and heating the stack at 190° C. for one hour. The initial adhesive force means a value measured within 24 hours after the preparation of the specimen. The curable resin composition film can be obtained by applying the curable resin composition to a substrate film and drying the curable resin composition. The polyimide may be Kapton 200H (available from Du Pont-Toray Co., Ltd., surface roughness: 0.03 to 0.07 μm). The tensile tester may be UCT-500 (available from Orientec Co., Ltd.), for example.

In the curable resin composition of the present invention, the cured product after storage at 200° C. for 100 hours has an adhesive force to polyimide of at least 0.8 times the initial adhesive force. With the cured product after storage at 200° C. for 100 hours having an adhesive force to polyimide of at least 0.8 times the initial adhesive force, the curable resin composition of the present invention can be suitably used in in-vehicle heat-resistance adhesives, for example. The adhesive force of the cured product to polyimide after storage at 200° C. for 100 hours is preferably at least 0.85 times, more preferably at least 0.9 times the initial adhesive force.

The adhesive force of the cured product to polyimide after storage at 200° C. for 100 hours means a value obtained by preparing a specimen by the same manner as in the measurement of the initial adhesive force, storing it at 200° C. for 100 hours, then cooling it to 25° C., and measuring the adhesive force by the same method as the initial adhesive force within 24 hours after the cooling.

The curable resin composition of the first aspect of the present invention contains an imide oligomer (hereinafter also referred to as an "imide oligomer according to the present invention") having an imide skeleton in a main chain and a crosslinkable functional group at an end and having a number average molecular weight of 4,000 or less. The imide oligomer according to the present invention has excellent reactivity and excellent compatibility with curable resins such as epoxy resins. The presence of the imide oligomer according to the present invention allows the curable resin composition of the first aspect of the present invention to provide a cured product having excellent mechanical strength at high temperature and excellent long-term heat resistance.

The curable resin compositions of the second to fourth aspects of the present invention contain a curing agent.

The curing agent is preferably an imide oligomer, more preferably the above imide oligomer according to the present invention. When the curable resin compositions of the second to fourth aspects of the present invention contains the imide oligomer according to the present invention, the cured product of the curable resin composition has better mechanical strength at high temperature and better long-term heat resistance.

The crosslinkable functional group is preferably a functional group capable of reacting with an epoxy group.

Examples of the functional group capable of reacting with an epoxy group include an amino group, a carboxy group, an acid anhydride group, a phenolic hydroxy group, an unsaturated group, an active ester group, and a maleimide group. In particular, the functional group is more preferably at least one of an acid anhydride group or a phenolic hydroxy group. The imide oligomer according to the present invention may have the crosslinkable functional group at one end or both ends. When the imide oligomer has the crosslinkable functional group at both ends, the crosslinking density is increased, so that a high glass transition temperature can be obtained after curing. When the imide oligomer has the crosslinkable functional group at one end, the functional group equivalent amount is large, which allows the curable resin composition to contain an increased amount of the imide oligomer according to the present invention. The resulting cured product thus has better long-term heat resistance.

The imide oligomer according to the present invention preferably contains a structure of the following formula (1-1) or the following formula (1-2) as a structure containing the crosslinkable functional group. The presence of a structure of the following formula (1-1) or the following formula (1-2) allows the imide oligomer according to the present invention to have excellent reactivity and excellent compatibility with curable resins such as epoxy resins.

[Chem. 1]

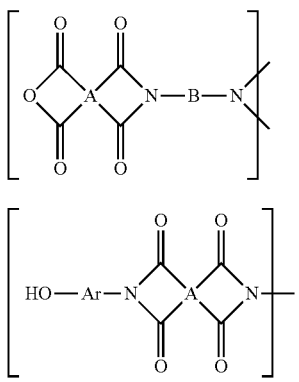

(1-1)

(1-2)

In the formula (1-1) and the formula (1-2), A is a tetravalent group of the following formula (2-1) or the following formula (2-2); in the formula (1-1), B is a divalent group of the following formula (3-1) or the following formula (3-2); and in the formula (1-2), Ar is a substituted or unsubstituted divalent aromatic group.

[Chem. 2]

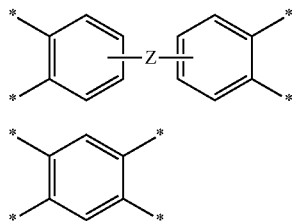

(2-1)

(2-2)

In the formula (2-1) and the formula (2-2), * is a binding site; in the formula (2-1), Z is a bond, an oxygen atom, or a substituted or unsubstituted divalent hydrocarbon group that may have an oxygen atom at a binding site; and in the formula (2-1) and the formula (2-2), a hydrogen atom of an aromatic ring may be replaced.

[Chem. 3]

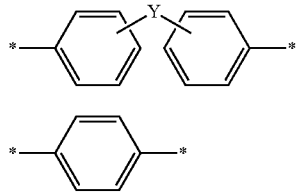

(3-1)

(3-2)

In the formula (3-1) and the formula (3-2), * is a binding site; in the formula (3-1), Y is a bond, an oxygen atom, or a substituted or unsubstituted divalent hydrocarbon group; and in the formula (3-1) and the formula (3-2), a hydrogen atom of an aromatic ring may be replaced.

The imide oligomer according to the present invention is preferably an imide oligomer having no siloxane skeleton in its structure because the siloxane skeleton may reduce the glass transition temperature after curing or cause defective adhesion by contaminating an adherend.

The imide oligomer according to the present invention has a number average molecular weight of 4,000 or less. With the number average molecular weight within this range, the cured product of the resulting curable resin composition has excellent long-term heat resistance. The upper limit of the number average molecular weight of the imide oligomer according to the present invention is preferably 3,400, more preferably 2,800.

In particular, the imide oligomer according to the present invention preferably has a number average molecular weight of 900 or more and 4,000 or less when the imide oligomer has a structure of the above formula (1-1). The imide oligomer according to the present invention preferably has a number average molecular weight of 550 or more and 4,000 or less when the imide oligomer has a structure of the above formula (1-2). The lower limit of the number average molecular weight when the imide oligomer has a structure of the above formula (1-1) is more preferably 950, still more preferably 1,000. The lower limit of the number average molecular weight when the imide oligomer has a structure of the above formula (1-2) is more preferably 580, still more preferably 600.

The "number average molecular weight" as used herein means a value in terms of polystyrene determined by gel permeation chromatography (GPC) using tetrahydrofuran as a solvent. The column for the measurement of the number average molecular weight in terms of polystyrene by GPC may be JAIGEL-2H-A (available from Japan Analytical Industry Co., Ltd.), for example.

Specifically, the imide oligomer according to the present invention is preferably an imide oligomer of the following formula (4-1), the following formula (4-2), the following formula (4-3), or the following formula (4-4), or an imide oligomer of the following formula (5-1), the following formula (5-2), following the formula (5-3), or the following formula (5-4).

[Chem. 4]

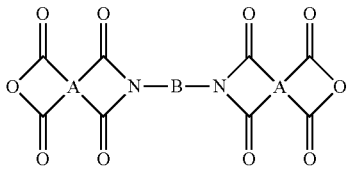

(4-1)

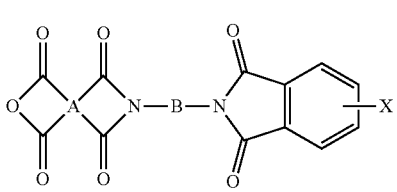

(4-2)

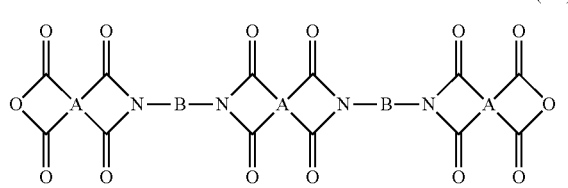

(4-3)

(4-4)

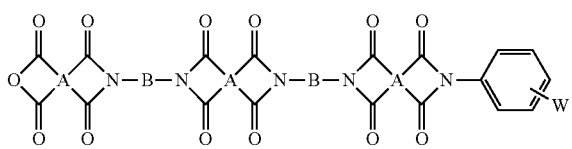

In the formulae (4-1) to (4-4), A is a tetravalent group of the following formula (6-1) or the following formula (6-2); in the formula (4-1), the formula (4-3), and the formula (4-4), each A may be the same or different; in the formulae (4-1) to (4-4), B is a divalent group of the following formula (7-1) or the following formula (7-2); in the formula (4-3) and the formula (4-4), each B may be the same or different; in the formula (4-2), X is a hydrogen atom, a halogen atom, or a substituted or unsubstituted monovalent hydrocarbon group; and in the formula (4-4), W is a hydrogen atom, a halogen atom, or a substituted or unsubstituted monovalent hydrocarbon group.

[Chem. 5]

(5-1)

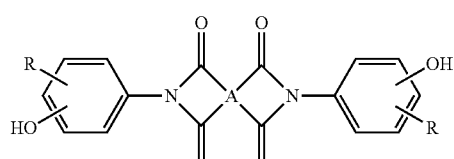

(5-2)

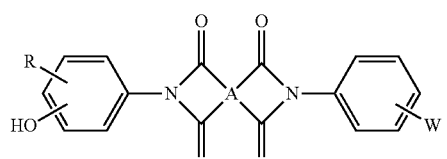

(5-3)

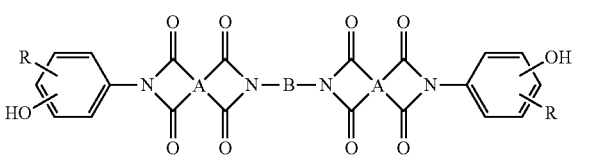

(5-4)

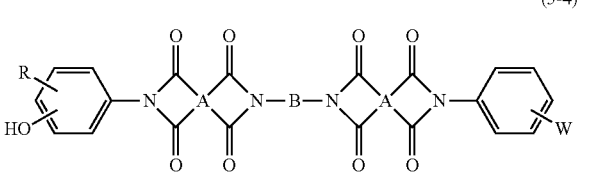

In the formulae (5-1) to (5-4), A is a tetravalent group of the following formula (6-1) or the following formula (6-2); in the formula (5-3) and the formula (5-4), each A may be the same or different; in the formulae (5-1) to (5-4), R is a hydrogen atom, a halogen atom, or a substituted or unsubstituted monovalent hydrocarbon group; in the formula (5-1) and the formula (5-3), each R may be the same or different; in the formula (5-2) and the formula (5-4), W is a hydrogen atom, a halogen atom, or a substituted or unsubstituted monovalent hydrocarbon group; and in the formula (5-3) and the formula (5-4), B is a divalent group of the following formula (7-1) or the following formula (7-2).

[Chem. 6]

(6-1)

(6-2)

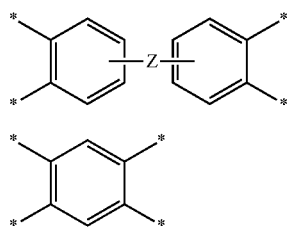

In the formula (6-1) and the formula (6-2), * is a binding site; in the formula (6-1), Z is a bond, an oxygen atom, or a substituted or unsubstituted divalent hydrocarbon group that may have an oxygen atom at a binding site; and in the formula (6-1) and the formula (6-2), a hydrogen atom of an aromatic ring may be replaced.

[Chem. 7]

(7-1)

(7-2)

In the formula (7-1) and the formula (7-2), * is a binding site; in the formula (7-1), Y is a bond, an oxygen atom, or a substituted or unsubstituted divalent hydrocarbon group; in the formula (7-1) and the formula (7-2), a hydrogen atom of an aromatic ring may be replaced.

Among the imide oligomers according to the present invention, the imide oligomer having a structure of the above formula (1-1) may be produced by, for example, reacting an acid dianhydride of the following formula (8) with a diamine of the following formula (9).

[Chem. 8]

(8)

In the formula (8), A is the same tetravalent group as A in the above formula (1-1).

[Chem. 9]

(9)

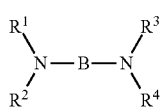

In the formula (9), B is the same divalent group as B in the above formula (1-1). $R^1$ to $R^4$ are each independently a hydrogen atom or a monovalent hydrocarbon group.

The following shows a specific exemplary method for reacting an acid dianhydride of the above formula (8) with a diamine of the above formula (9).

First, the diamine of the above formula (9) is dissolved in a solvent in which the amic acid oligomer to be obtained by reaction can be dissolved (e.g., N-methylpyrrolidone). To the resulting solution is added the acid dianhydride of the above formula (8), and the mixture is reacted to give an amic acid oligomer solution. Next, the solvent is removed by heating, depressurization, or the like. Then, the amic acid oligomer is reacted by heating at about 200° C. or higher for one hour or longer. An imide oligomer having a desired number average molecular weight and having a structure of the above formula (1-1) at both ends can be obtained by adjusting the molar ratio between the acid dianhydride of the above formula (8) and the diamine of the above formula (9) and imidization conditions.

By replacing part of the acid dianhydride of the above formula (8) with an acid anhydride of the following formula (10), it is possible to produce an imide oligomer having a desired number average molecular weight and having a structure of the above formula (1-1) at one end and a structure derived from the acid anhydride of the following formula (10) at the other end. In this case, the acid dianhydride of the above formula (8) and the acid anhydride of the following formula (10) may be added at the same time or separately.

By replacing part of the diamine of the above formula (9) with a monoamine of the following formula (11), it is possible to produce an imide oligomer having a desired number average molecular weight and having a structure of the above formula (1-1) at one end and a structure derived from the monoamine of the following formula (11) at the other end. In this case, the diamine of the above formula (9) and the monoamine of the following formula (11) may be added at the same time or separately.

[Chem. 10]

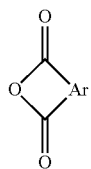

(10)

In the formula (10), Ar is a substituted or unsubstituted divalent aromatic group.

[Chem. 11]

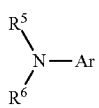

(11)

In the formula (11), Ar is a substituted or unsubstituted monovalent aromatic group, and $R^5$ and $R^6$ are each independently a hydrogen atom or a monovalent hydrocarbon group.

Among the imide oligomers according to the present invention, the imide oligomer having a structure of the above formula (1-2) may be produced by, for example, reacting an acid dianhydride of the above formula (8) with a phenolic hydroxy group-containing monoamine of the following formula (12).

[Chem. 12]

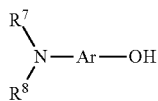

(12)

In the formula (12), Ar is a substituted or unsubstituted divalent aromatic group, and $R^7$ and $R^8$ are each independently a hydrogen atom or a monovalent hydrocarbon group.

The following shows a specific exemplary method for reacting an acid dianhydride of the above formula (8) and a phenolic hydroxy group-containing monoamine of the above formula (12).

First, the phenolic hydroxy group-containing monoamine of the formula (12) is dissolved in a solvent in which the amic acid oligomer to be obtained by reaction can be dissolved (e.g., N-methylpyrrolidone). To the resulting solution is added the acid dianhydride of the above formula (8), and the mixture is reacted to give an amic acid oligomer solution. Next, the solvent is removed by heating, depressurization, or the like. Then, the amic acid oligomer is reacted by heating at about 200° C. or higher for one hour or longer. An imide oligomer having a desired number average molecular weight and having a structure of the above formula (1-2) at both ends can be obtained by adjusting the molar ratio between the acid dianhydride of the above formula (8) and the phenolic hydroxy group-containing monoamine of the above formula (12) and imidization conditions.

By replacing part of the phenolic hydroxy group-containing monoamine of the above formula (12) with a monoamine of the above formula (11), it is possible to produce an imide oligomer having a desired number average molecular weight and having a structure of the above formula (1-2) at one end and a structure derived from the monoamine of the above formula (11) at the other end. In this case, the phenolic hydroxy group-containing monoamine of the above formula (12) and the monoamine of the above formula (11) may be added at the same time or separately.

Examples of the acid dianhydride of the above formula (8) include pyromellitic dianhydride, 3,3'-oxydiphthalic dianhydride, 3,4'-oxydiphthalic dianhydride, 4,4'-oxydiphthalic dianhydride, 4,4'-(4,4'-isopropylidenediphenoxy)diphthalic anhydride, 4,4'-bis(2,3-dicarboxylphenoxy)diphenyl ether dianhydride, p-phenylenebis(trimellitate anhydride), and 2,3,3',4'-biphenyltetracarboxylic dianhydride.

In particular, for better solubility and better heat resistance, the acid dianhydride used as a raw material of the imide oligomer of the present invention is preferably an aromatic acid dianhydride having a melting point of 240° C. or lower, more preferably an aromatic acid dianhydride having a melting point of 220° C. or lower, still more preferably an aromatic acid dianhydride having a melting point of 200° C. or lower, particularly preferably 3,4'- oxydiphthalic dianhydride (melting point: 180° C.) or 4,4'-(4,4'-isopropylidenediphenoxy)diphthalic anhydride (melting point: 190° C.)

The "melting point" as used herein means a value measured as the endothermic peak temperature using a differential scanning calorimeter at a temperature increase rate of 10° C./min. The differential scanning calorimeter may be EXTEAR DSC6100 (available from SII NanoTechnology Inc.), for example.

Examples of the diamine of the above formula (9) include 3,3'-diaminodiphenylmethane, 3,4'-diaminodiphenylmethane, 4,4'-diaminodiphenylmethane, 3,3'-diaminodiphenyl ether, 3,4'-diaminodiphenyl ether, 4,4'-diaminodiphenyl ether, o-phenylenediamine, m-phenylenediamine, p-phenylenediamine, 3,3'-diaminodiphenylsulfone, 4,4'-diaminodiphenylsulfone, 1,3-bis(3-aminophenoxy)benzene, 1,3-bis(4-aminophenoxy)benzene, 1,4-bis(4-aminophenoxy)benzene, bis(4-(4-aminophenoxy)phenyl)methane, 2,2-bis(4-(4-aminophenoxy)phenyl)propane, 1,3-bis(2-(4-aminophenyl)-2-propyl)benzene, 1,4-bis(2-(4-aminophenyl)-2-propyl)benzene, 3,3'-diamino-4,4'-dihydroxyphenylmethane, 4,4'-diamino-3,3'-dihydroxyphenylmethane, 3,3'-diamino-4,4'-dihydroxyphenyl ether, bisaminophenylfluorene, bistoluidinefluorene, 4,4'-bis(4-aminophenoxy)biphenyl, 4,4'-diamino-3,3'-dihydroxyphenyl ether, 3,3'-diamino-4,4'-dihydroxybiphenyl, and 4,4'-diamino-2,2'-dihydroxybiphenyl. Preferred among them are 4,4'-diaminodiphenylmethane, 4,4'-diaminodiphenyl ether, 1,3-bis(2-(4-aminophenyl)-2-propyl)benzene, 1,4-bis(2-(4-aminophenyl)-2-propyl)benzene, 1,3-bis(3-aminophenoxy)benzene, 1,3-bis(4-aminophenoxy)benzene, and 1,4-bis(4-aminophenoxy)benzene because they have excellent availability. More preferred are 1,3-bis(2-(4-aminophenyl)-2-propyl)benzene, 1,4-bis(2-(4-aminophenyl)-2-propyl)benzene, 1,3-bis(3-aminophenoxy)benzene, 1,3-bis(4-aminophenoxy)benzene, and 1,4-bis(4-aminophenoxy)benzene because they have excellent solubility and excellent heat resistance.

Examples of the acid anhydride of the above formula (10) include phthalic anhydride, 3-methylphthalic anhydride, 4-methylphthalic anhydride, 1,2-naphthalic anhydride, 2,3-naphthalic anhydride, 1,8-naphthalic anhydride, 2,3-anthracenedicarboxylic anhydride, 4-tert-butylphthalic anhydride, 4-ethynylphthalic anhydride, 4-phenylethynylphthalic anhydride, 4-fluorophthalic anhydride, 4-chlorophthalic anhydride, 4-bromphthalic anhydride, and 3,4-dichlorophthalic anhydride.

Examples of the monoamine of the above formula (11) include aniline, o-toluidine, m-toluidine, p-toluidine, 2,4-dimethylaniline, 3,4-dimethylaniline, 3,5-dimethylaniline, 2-tert-butylaniline, 3-tert-butylaniline, 4-tert-butylaniline, 1-naphthylamine, 2-naphthylamine, 1-aminoanthracene, 2-aminoanthracene, 9-aminoanthracene, 1-aminopyrene, 3-chloroaniline, o-anisidine, 1-amino-2-methylnaphthalene, 2,3-dimethylaniline, 2,4-dimethylaniline, 2,5-dimethylaniline, 3,4-dimethylaniline, 4-ethylaniline, 4-ethynylaniline, 4-isopropylaniline, 4-(methylthio)aniline, and N,N-dimethyl-1,4-phenylenediamine.

Examples of the phenolic hydroxy group-containing monoamine of the above formula (12) include 3-aminophenol, 4-aminophenol, 4-amino-o-cresol, 5-amino-o-cresol, 4-amino-2,3-xylenol, 4-amino-2,5-xylenol, 4-amino-2,6-xylenol, 4-amino-1-naphthol, 5-amino-2-naphthol, 6-amino-1-naphthol, and 4-amino-2,6-diphenylphenol. Preferred among them are 4-amino-o-cresol and 5-amino-o-cresol because they have excellent availability and excellent storage stability and lead to a high glass transition temperature after curing.

When the imide oligomer according to the present invention is produced by any of the above methods, the imide oligomer according to the present invention is obtained as a component of a mixture (imide oligomer composition) containing multiple types of imide oligomers each having a structure of the above formula (1-1) or multiple types of imide oligomers each having a structure of the above formula (1-2) and raw materials. When the imide oligomer composition has an imidization ratio of 70% or higher, the use of the imide oligomer composition as a curing agent leads to a cured product having better mechanical strength at high temperature and better long-term heat resistance.

The lower limit of the imidization ratio of the imide oligomer composition is preferably 75%, more preferably 80%. There is no particular preferable upper limit of the imidization ratio of the imide oligomer composition. The upper limit is practically 98%.

The "imidization ratio" is measured using a Fourier transform infrared spectrophotometer (FT-IR) by the attenuated total reflection method (ATR method). The imidization ratio can be determined using the following formula based on the peak absorbance area near 1660 cm$^{-1}$ derived from the carbonyl group of amic acid. The Fourier transform infrared spectrophotometer may be UMA 600 (available from Agilent Technologies, Inc.), for example. The "Peak absorbance area of amic acid oligomer" in the following formula is the absorbance area of an amic acid oligomer obtained by reacting the acid dianhydride with the diamine or the phenolic hydroxy group-containing monoamine and then removing the solvent by evaporation or the like without the imidization step.

Imidization ratio (%)=100×(1−(Peak absorbance area after imidization)/(Peak absorbance area of amic acid oligomer))

The imide oligomer composition is preferably soluble in an amount of 3 g or more in 10 g of tetrahydrofuran at 25° C. from the standpoint of the solubility when the imide oligomer composition is used as a curing agent in a curable resin composition.

The imide oligomer composition preferably has a melting point of 200° C. or lower from the standpoint of the handleability when the imide oligomer composition is used as a curing agent in a curable resin composition. The melting point of the imide oligomer composition of the present invention is more preferably 190° C. or lower, still more preferably 180° C. or lower.

The lower limit of the melting point of the imide oligomer composition is not limited, but is preferably 60° C. or higher.

In the curable resin composition of the first aspect of the present invention, the lower limit of the amount of the imide oligomer according to the present invention is preferably 20% by weight relative to the total weight of the curable resin, the imide oligomer, and the curing accelerator. The upper limit thereof is preferably 80% by weight. When the amount of the imide oligomer according to the present invention is within the range, the resulting cured product has better mechanical strength at high temperature and better long-term heat resistance. The lower limit of the amount of the imide oligomer according to the present invention is more preferably 25% by weight and the upper limit thereof is more preferably 75% by weight.

For purposes such as improving the processability in the uncured state, the curable resin composition of the present invention may contain a different curing agent in addition to the curing agent according to the present invention without inhibiting the purposes of the present invention.

Examples of the different curing agent include phenol curing agents, thiol curing agents, amine curing agents, acid anhydride curing agents, cyanate curing agents, and active ester curing agent. Preferred among them are phenol curing agents, acid anhydride curing agents, cyanate curing agents, and active ester curing agents.

When the curable resin composition of the first aspect of the present invention contains the different curing agent, the upper limit of the proportion of the different curing agent in the total amount of the curing agents is preferably 70% by weight, more preferably 50% by weight, still more preferably 30% by weight.

When the curable resin compositions of the second to fourth aspects of the present invention contain the imide oligomer according to the present invention and the different curing agent, the upper limit of the proportion of the different curing agent in the total amount of the curing agents is preferably 70% by weight, more preferably 50% by weight, still more preferably 30% by weight.

When the curable resin compositions according to the second to fourth aspects of the present invention contain the imide oligomer according to the present invention as the curing agent, the lower limit of the amount of the imide oligomer is preferably 20% by weight relative to the total weight of the curable resin and the imide oligomer (and the curing accelerator described later, if contained) and the upper limit thereof is preferably 80% by weight.

When the amount of the imide oligomer is within the range, the resulting cured product has excellent mechanical strength at high temperature and excellent long-term heat resistance. The lower limit of the amount of the imide oligomer is more preferably 25% by weight and the upper limit thereof is more preferably 75% by weight.

The curable resin composition of the present invention contains a curable resin.

Examples of the curable resin in the curable resin composition of the first aspect of the present invention include epoxy resins, acrylic resins, phenolic resins, cyanate resins, isocyanate resins, maleimide resins, benzoxazine resins, silicone resins, fluororesins, polyimide resins, and phenoxy resins. Preferred among them are epoxy resins. These curable resins may be used alone or in combination of two or more thereof.

The curable resin in the curable resin compositions of the second to fourth aspects of the present invention is preferably at least one selected from the group consisting of an epoxy resin, a phenolic resin, a silicone resin, a fluororesin, a polyimide resin, a maleimide resin, and a benzoxazine resin. In particular, the curable resin is more preferably an epoxy resin. These curable resins may be used alone or in combination of two or more thereof.

When the curable resin composition is processed into a film, the curable resin is preferably liquid or semisolid at 25° C., more preferably liquid at 25° C. for good handleability.

Examples of the epoxy resin include bisphenol A epoxy resins, bisphenol F epoxy resins, bisphenol E epoxy resins, bisphenol S epoxy resins, 2,2'-diallylbisphenol A epoxy resins, hydrogenated bisphenol epoxy resins, propylene oxide-added bisphenol A epoxy resins, resorcinol epoxy resins, biphenyl epoxy resins, sulfide epoxy resins, diphenyl ether epoxy resins, dicyclopentadiene epoxy resins, naphthalene epoxy resins, fluorene epoxy resins, naphtylene ether epoxy resins, phenol novolac epoxy resins, ortho-cresol novolac epoxy resins, dicyclopentadiene novolac epoxy resins, biphenyl novolac epoxy resins, naphthalene phenol novolac epoxy resins, glycidylamine epoxy resins, alkyl polyol epoxy resins, rubber-modified epoxy resins, and glycidyl ester compounds. Preferred among them are bisphenol A epoxy resins, bisphenol F epoxy resins, bisphenol E epoxy resins, and resorcinol epoxy resins because they have low viscosity that makes it easy to adjust the processability of the resulting curable resin composition at room temperature.

The curable resin composition of the first aspect of the present invention contains a curing accelerator. The curable resin compositions of the second to fourth aspects of the present invention preferably contain a curing accelerator.

The curing accelerator contained in the curable resin composition can shorten the curing time and improve the productivity.

Examples of the curing accelerator include imidazole curing accelerators, tertiary amine curing accelerators, phosphine curing accelerators, photobase generators, and sulfonium salt curing accelerators. Preferred among them are imidazole curing accelerators and phosphine curing accelerators from the standpoint of storage stability and curability.

The lower limit of the amount of the curing accelerator in the curable resin composition of the present invention is preferably 0.8% by weight relative to the total weight of the curable resin, the curing agent, and the curing accelerator. When the amount of the curing accelerator is 0.8% by weight or more, the effect of shortening the curing time can be better. The lower limit of the amount of the curing accelerator is more preferably 1% by weight.

The upper limit of the amount of the curing accelerator is preferably 10% by weight, more preferably 5% by weight from the standpoint of the adhesiveness and the like.

The curable resin composition of the present invention may contain an organic filler for purposes such as stress relaxation or imparting toughness.

Any organic filler may be used. Examples thereof include silicone rubber particles, acrylic rubber particles, urethane rubber particles, polyamide particles, polyamideimide particles, polyimide particles, benzoguanamine particles, and any of these particles with a core-shell structure. Preferred among them are polyamide particles, polyamideimide particles, and polyimide particles.

The lower limit of the amount of the organic filler is preferably 10 parts by weight and the upper limit thereof is preferably 500 parts by weight relative to 100 parts by weight of the curable resin. When the amount of the organic filler is within the range, the resulting cured product has better toughness while maintaining excellent adhesiveness and the like. The lower limit of the amount of the organic filler is more preferably 30 parts by weight and the upper limit thereof is more preferably 400 parts by weight.

The curable resin composition of the present invention may contain an inorganic filler for purposes such as lowering the linear expansion coefficient after curing to reduce warping, or improving the adhesion reliability. The inorganic filler may also be used as a fluidity modifier.

Examples of the inorganic filler include silica such as fumed silica and colloidal silica, barium sulfate, alumina, aluminum nitride, boron nitride, silicon nitride, glass powder, glass frit, glass fiber, carbon fiber, and inorganic ion exchangers.

The lower limit of the amount of the inorganic filler is preferably 10 parts by weight and the upper limit thereof is preferably 500 parts by weight relative to 100 parts by weight of the curable resin. When the amount of the inorganic filler is within the range, the effect of improving the adhesion reliability and the like can be better while excellent adhesiveness and the like are maintained. The lower limit of the amount of the inorganic filler is more preferably 30 parts by weight and the upper limit thereof is more preferably 400 parts by weight.

The curable resin composition of the present invention may contain a polymer compound without inhibiting the purposes of the present invention. The polymer compound serves as a film-forming component.

The polymer compound may contain a reactive functional group.

Examples of the reactive functional group include an amino group, a urethane group, an imide group, a hydroxy group, a carboxy group, and an epoxy group.

The polymer compound may or may not form a phase separation structure in the cured product. When the polymer compound does not form a phase separation structure in the cured product, the polymer compound is preferably a polymer compound having an epoxy group as the reactive functional group because better mechanical strength at high temperature, better long-term heat resistance, and better moisture resistance can be achieved.

The curable resin composition of the present invention may contain a solvent from the standpoint of coating properties or the like.

The solvent is preferably a nonpolar solvent having a boiling point of 120° C. or lower or an aprotic polar solvent having a boiling point of 120° C. or lower from the standpoint of the coating properties, the storage stability, and the like.

Examples of the nonpolar solvent having a boiling point of 120° C. or lower or the aprotic polar solvent having a boiling point of 120° C. or lower include ketone solvents, ester solvents, hydrocarbon solvents, halogen solvents, ether solvents, and nitrogen-containing solvents.

Examples of the ketone solvent include acetone, methyl ethyl ketone, and methyl isobutyl ketone.

Examples of the ester solvent include methyl acetate, ethyl acetate, isobutyl acetate.

Examples of the hydrocarbon solvent include benzene, toluene, normal hexane, isohexane, cyclohexane, methylcyclohexane, and normal heptane.

Examples of the halogen solvent include dichloromethane, chloroform, and trichloroethylene.

Examples of the ether solvent include diethyl ether, tetrahydrofuran, 1,4-dioxane, and 1,3-dioxolane.

Examples of the nitrogen-containing solvent include acetonitrile.

From the standpoint of the handleability, the solubility of the imide oligomer, and the like, the solvent is preferably at least one selected from the group consisting of a ketone solvent having a boiling point of 60° C. or higher, an ester solvent having a boiling point of 60° C. or higher, and an ether solvent having a boiling point of 60° C. or higher. Examples of such solvents include methyl ethyl ketone, methyl isobutyl ketone, ethyl acetate, isobutyl acetate, 1,4-dioxane, 1,3-dioxolane, and tetrahydrofuran.

The "boiling point" is a value measured at 101 kPa or a value converted to correspond to 101 kPa with a boiling point conversion chart, for example.

The lower limit of the amount of the solvent in the curable resin composition of the present invention is preferably 20% by weight and the upper limit thereof is preferably 90% by weight. When the amount of the solvent is within the range, the curable resin composition of the present invention has better coating properties and the like. The lower limit of the amount of the solvent is more preferably 30% by weight and the upper limit thereof is more preferably 80% by weight.

The curable resin composition of the present invention may contain a reactive diluent without inhibiting the purposes of the present invention.

The reactive diluent is preferably a reactive diluent having two or more reactive functional groups in one molecule from the standpoint of the adhesion reliability.

The curable resin composition of the present invention may further contain additives such as a coupling agent, a dispersant, a storage stabilizer, a bleeding preventing agent, a flux, and an organic or inorganic flame retardant.

The curable resin composition of the first aspect of the present invention may be produced by, for example, a method including mixing the curable resin, the imide oligomer according to the present invention, the curing accelerator, and optional ingredients such as the solvent using a mixer such as a homogenizing disperser, a universal mixer, a Banbury mixer, or a kneader.

The curable resin compositions of the second to fourth aspects of the present invention may be produced by, for example, a method including mixing the curable resin, the curing agent, and optional ingredients such as the curing accelerator or the solvent using a mixer such as a homogenizing disperser, a universal mixer, a Banbury mixer, or a kneader.

The curable resin composition of the second aspect of the present invention has a tack value at 60° C. of at least 2 times the tack value at 25° C. With the tack value at 60° C. of at least 2 times the tack value at 25° C., the curable resin composition of the second aspect of the present invention is excellent in handleability at room temperature, adhesiveness, and long-term heat resistance. The tack value at 60° C. is preferably at least 2.2 times, more preferably at least 2.5 times the tack value at 25° C. The curable resin composition of the second aspect of the present invention preferably has a tack value at 25° C. of 20 gf/5 mmp or less, more preferably 15 gf/5 mmp or less, still more preferably 10 gf/5 mmp or less.

The "tack value" as used herein means a tac value measured using a probe tack measuring device (e.g., Tackiness Tester TAC-2 (available from RHESCA Co., Ltd.)) under the measurement conditions of a probe diameter of 5 mm, a contact speed of 0.5 mm/sec, a test speed of 0.5 mm/sec, a contact load of 0.05 MPa, and a contact time of 1 second. The tack value can be obtained by preparing a curable resin composition film (thickness of the curable resin composition layer: about 20 μm) by applying the curable resin composition to a substrate film such as PET or polyimide and drying the curable composition, and measuring the tack value of the curable resin composition film at the side opposite to the substrate film side.

The curable resin composition of the third aspect of the present invention has a surface free energy of 40 mJ/m$^2$ or more. With the surface free energy of 40 mJ/m$^2$ or more, the curable resin composition of the third aspect of the present invention is excellent in adhesiveness and long-term heat resistance. The surface free energy is preferably 41 mJ/m$^2$ or more, more preferably 42 mJ/m$^2$ or more.

The "surface free energy" as used herein can be calculated by the following formulae based on the measurement of the contact angle (drop volume: 3 μL, 30 seconds after dropping) with water and methylene iodide using a contact angle meter.

$\gamma s = \gamma sd + \gamma sp$
$72.8(1+ \cos \theta H) = 2(21.8\gamma sd)^{1/2} + 2(51.0\gamma sp)^{1/2}$
$50.8(1+ \cos \theta I) = 2(48.5\gamma sd)^{1/2} + 2(2.3\gamma sp)^{1/2}$ γs: surface free energy
γsd: dispersive component of surface free energy
γsp: polar component of surface free energy
θH: contact angle with water
θI: contact angle with methylene iodide The surface free energy can be obtained by preparing a curable resin composition film (thickness of the curable resin composition layer: about 20 µm) in the same manner as in the measurement of the tack value and determining the surface free energy of the curable resin composition film at the side opposite to the substrate film side.

The cured product of the curable resin composition of the fourth aspect of the present invention after storage in an environment at 85° C. and 85% RH for 24 hours has an adhesive force to polyimide of at least 0.8 times the initial adhesive force. With the cured product after storage in an environment at 85° C. and 85% RH for 24 hours having an adhesive force to polyimide of at least 0.8 times the initial adhesive force, the curable resin composition of the fourth aspect of the present invention is excellent in adhesiveness and long-term heat resistance. The adhesive force of the cured product to polyimide after storage in an environment at 85° C. and 85% RH for 24 hours is preferably at least 0.85 times, more preferably at least 0.9 times the initial adhesive force.

The adhesive force of the cured product to polyimide after storage in an environment at 85° C. and 85% RH for 24 hours means a value obtained by preparing a specimen in the same manner as in the measurement of the initial adhesive force, storing it in an environment at 85° C. and 85% RH for 24 hours, then cooling it to 25° C., and measuring within 24 hours after the cooling the adhesive force by the same method as the initial adhesive force.

A curable resin composition film containing the curable resin composition of the present invention can be obtained by applying the curable resin composition to a substrate film and drying the curable resin composition. A cured product can be obtained by curing the curable resin composition film. A cured product of the curable resin composition of the present invention is also encompassed by the present invention.

The cured product of the present invention preferably has a glass transition temperature of 150° C. or higher, more preferably 160° C. or higher from the standpoint of the mechanical strength and the long-term heat resistance.

The glass transition temperature can be determined as the peak temperature on a tan δ curve obtained by analyzing a cured product having a thickness of 400 µm using a dynamic viscoelasticity measuring apparatus from 0° C. to 300° C. at a temperature increase rate of 10° C./min, a frequency of 10 Hz, and a chuck interval of 24 mm. The cured product with which the glass transition temperature is measured can be obtained by heating the above curable resin composition film at 190° C. for 30 minutes. The dynamic viscoelasticity measuring apparatus may be, for example, RHEOVIBRON Automatic Dynamic Viscoelastometer DDV-GP series (available from A & D Company, Limited).

The cured product of the present invention preferably has a weight reduction ratio at 330° C. of less than 2.5%, more preferably less than 2.0% from the standpoint of the thermal decomposition resistance.

The weight reduction ratio can be determined by thermogravimetry of the curable resin composition film using a device for thermogravimetry from 30° C. to 400° C. at a temperature increase rate of 10° C./min. The weight reduction ratio is determined as the proportion of the weight that is reduced before the temperature reaches 330° C. The device for thermogravimetry may be EXTEAR TG/DTA6200 (available from SII NanoTechnology Inc.), for example.

The curable resin composition of the present invention can be used in a wide range of applications, and can be particularly suitably used in electronic material applications that require high heat resistance. For example, the curable resin composition can be used in: die attach agents in applications such as aircraft or in-vehicle electronic control units (ECUs), power devices containing SiC or GaN; adhesives for power overlay packaging; curable resin compositions for print wiring boards; adhesives for coverlays of flexible print circuit substrates; copper clad laminates; adhesives for semiconductor bonding; interlayer insulating films; pre-pregs; sealants for LEDs; and curable resin compositions for structure materials; or the like. In particular, the curable resin composition is suitably used in adhesive applications. An adhesive containing the curable resin composition of the present invention is also encompassed by the present invention.

The curable resin film can be suitably used as an adhesive film. An adhesive film containing the curable resin composition of the present invention is also encompassed by the present invention.

A coverlayer film including a substrate film and a layer containing the curable resin composition of the present invention formed on the substrate film is also encompassed by the present invention.

A flexible copper clad laminate including a substrate film, a layer containing the curable resin composition of the present invention formed on the substrate film, and copper foil is also encompassed by the present invention.

A circuit board including the cured product of the present invention, the coverlay film of the present invention, or the flexible copper clad laminate of the present invention is also encompassed by the present invention.

Advantageous Effects of Invention

The present invention can provide a curable resin composition capable of providing a cured product that has a high glass transition temperature after curing and is excellent in thermal decomposition resistance, adhesiveness, and long-term heat resistance. The present invention can also provide a cured product of the curable resin composition, an adhesive containing the curable resin composition, and an adhesive film, a coverlay film, a flexible copper clad laminate, and a circuit board each formed using the curable resin composition.

DESCRIPTION OF EMBODIMENTS

Embodiments of the present invention are specifically described in the following with reference to, but not limited to, examples.

SYNTHESIS EXAMPLE 1

Preparation of Imide Oligomer Composition A

An amount of 34.5 parts by weight of 1,3-bis(2-(4-aminophenyl)-2-propyl)benzene (available from Mitsui Fine Chemicals, Inc., "Bisaniline M") was dissolved in 400 parts by weight of N-methylpyrrolidone (available from Wako Pure Chemical Industries, Ltd., "NMP"). To the obtained solution was added 62.0 parts by weight of 3,4'-oxydiphthalic dianhydride (available from Tokyo Chemical Industry Co., Ltd., "3,4'-ODPA"), followed by stirring at 25° C. for two hours to cause reaction to give an amic acid oligomer solution. N-Methylpyrrolidone was removed from the obtained amic acid oligomer solution under reduced pressure, followed by heating at 300° C. for two hours to give an imide oligomer composition A (imidization ratio: 92a).

$^1$H-NMR, GPC, and FT-IR analyses showed that the imide oligomer composition A contained an imide oligomer having a structure of the above formula (1-1) (A is a group of the following formula (13) and B is a group of the following formula (14)). The imide oligomer having a structure of the formula (1-1) had a number average molecular weight of 1,380. The analyses further showed that the imide oligomer composition A contained an imide oligomer of the above formula (4-1) (A is a group of the following formula (13) and B is a group of the following formula (14)) as the imide oligomer having a structure of the formula (1-1).

[Chem. 13]

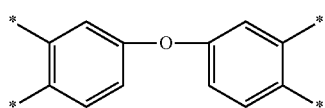

(13)

In the formula (13), * is a binding site.

[Chem. 14]

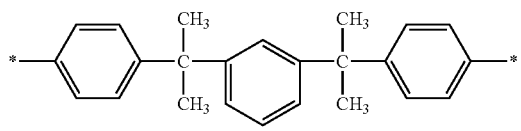

(14)

In the formula (14), * is a binding site.

SYNTHESIS EXAMPLE 2

Preparation of Imide Oligomer Composition B

An imide oligomer composition B (imidization ratio: 92%) was obtained as in Synthesis Example 1 except that 34.5 parts by weight of 1,3-bis(2-(4-aminophenyl)-2-propyl)benzene was changed to 34.5 parts by weight of 1,4-bis(2-(4-aminophenyl)-2-propyl)benzene (available from Mitsui Fine Chemicals, Inc., "Bisaniline P").

$^1$H-NMR, GPC, and FT-IR analyses showed that the imide oligomer composition B contained an imide oligomer having a structure of the above formula (1-1) (A is a group of the above formula (13) and B is a group of the following formula (15)). The imide oligomer having a structure of the formula (1-1) had a number average molecular weight of 1,390. The analyses further showed that the imide oligomer composition B contained an imide oligomer of the above formula (4-1) (A is a group of the above formula (13) and B is a group of the following formula (15)) as the imide oligomer having a structure of the formula (1-1).

[Chem. 15]

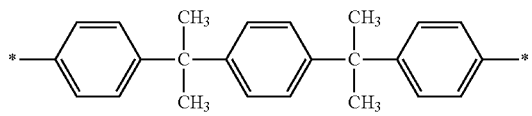

(15)

In the formula (15), * is a binding site.

SYNTHESIS EXAMPLE 3

Preparation of Imide Oligomer Composition C

An imide oligomer composition C (imidization ratio: 91%) was obtained as in Synthesis Example 1 except that 34.5 parts by weight of 1,3-bis(2-(4-aminophenyl)-2-propyl)benzene was changed to 29.2 parts by weight of 1,3-bis(3-aminophenoxy)benzene (available from Mitsui Fine Chemicals, Inc., "APB-N").

$^1$H-NMR, GPC, and FT-IR analyses showed that the imide oligomer composition C contained an imide oligomer having a structure of the above formula (1-1) (A is a group of the above formula (13) and B is a group of the following formula (16)). The imide oligomer composition C had a number average molecular weight of 1,310. The analyses further showed that the imide oligomer composition C contained an imide oligomer of the above formula (4-1) (A is a group of the above formula (13) and B is a group of the following formula (16)) as the imide oligomer having a structure of the formula (1-1).

[Chem. 16]

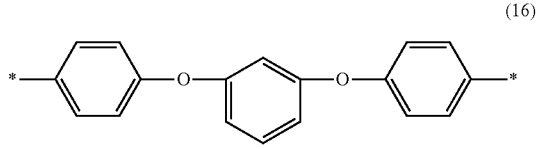

(16)

In the formula (16), * is a binding site.

SYNTHESIS EXAMPLE 4

Preparation of Imide Oligomer Composition D

An imide oligomer composition D (imidization ratio: 93%) was obtained as in Synthesis Example 1 except that 62.0 parts by weight of 3,4'-oxydiphthalic dianhydride was changed to 104.1 parts by weight of 4,4'-(4,4'-isopropylidenediphenoxy)diphthalic anhydride (available from Tokyo Chemical Industry Co., Ltd.).

$^1$H-NMR, GPC, and FT-IR analyses showed that the imide oligomer composition D contained an imide oligomer having a structure of the above formula (1-1) (A is a group of the following formula (17) and B is a group of the above formula (14)). The imide oligomer having a structure of the formula (1-1) had a number average molecular weight of 2,020. The analyses further showed that the imide oligomer composition D contained an imide oligomer of the above formula (4-1) (A is a group of the following formula (17) and B is a group of the above formula (14)) as the imide oligomer having a structure of the formula (1-1).

[Chem. 17]

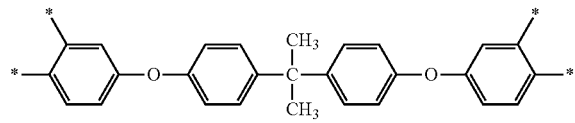

(17)

In the formula (17), * is a binding site.

SYNTHESIS EXAMPLE 5

Preparation of Imide Oligomer Composition E

An imide oligomer composition E (imidization ratio: 91%) was obtained as in Synthesis Example 4 except that the amount of 4,4'-(4,4'-isopropylidenediphenoxy)diphthalic anhydride added was changed to 98.9 parts by weight.

$^1$H-NMR, GPC, and FT-IR analyses showed that the imide oligomer composition E contained an imide oligomer having a structure of the above formula (1-1) (A is a group of the above formula (17) and B is a group of the above formula (14)). The imide oligomer having a structure of the formula (1-1) had a number average molecular weight of 2,520. The analyses further showed that the imide oligomer composition E contained an imide oligomer of the above formula (4-1) (A is a group of the formula (17) and B is a group of the above formula (14)) as the imide oligomer having a structure of the formula (1-1).

SYNTHESIS EXAMPLE 6

Preparation of Imide Oligomer Composition F

An imide oligomer composition F (imidization ratio: 92%) was obtained as in Synthesis Example 1 except that the amount of 3,4'-oxydiphthalic dianhydride added was changed to 65.1 parts by weight.

$^1$H-NMR, GPC, and FT-IR analyses showed that the imide oligomer composition F contained an imide oligomer having a structure of the above formula (1-1) (A is a group of the above formula (13) and B is a group of the above formula (14)). The imide oligomer having a structure of the formula (1-1) had a number average molecular weight of 1,220. The analyses further showed that the imide oligomer composition F contained an imide oligomer of the above formula (4-1) (A is a group of the above formula (13) and B is a group of the above formula (14)) as the imide oligomer having a structure of the formula (1-1).

SYNTHESIS EXAMPLE 7

Preparation of Imide Oligomer Composition G

An amount of 34.5 parts by weight of 1,3-bis(2-(4-aminophenyl)-2-propyl)benzene (available from Mitsui Fine Chemicals, Inc., "Bisaniline M") was dissolved in 400 parts by weight of N-methylpyrrolidone (available from Wako Pure Chemical Industries, Ltd., "NMP"). To the obtained solution was added 62.0 parts by weight of 3,4'-oxydiphthalic dianhydride (available fom Tokyo Chemical Industry Co., Ltd., "3,4'-ODPA"), followed by stirring at 25° C. for two hours to cause reaction to give an amic acid oligomer solution. The amic acid oligomer solution was heated at 180° C. for three hours in N-methylpyrrolidone while removing with a Dean-Stark tube the water generated from imidization, and then N-methylpyrrolidone was removed under reduced pressure. Thus, an imide oligomer composition G (imidization ratio: 23%) was obtained.

$^1$H-NMR, GPC, and FT-IR analyses showed that the imide oligomer composition G contained an imide oligomer having a structure of the above formula (1-1) (A is a group of the above formula (13) and B is a group of the above formula (14)). The imide oligomer having a structure of the formula (1-1) had a number average molecular weight of 1,400. The analyses further showed that the imide oligomer composition G contained an imide oligomer of the above formula (4-1) (A is a group of the above formula (13) and B is a group of the above formula (14)) as the imide oligomer having a structure of the formula (1-1).

SYNTHESIS EXAMPLE 8

Preparation of Imide Oligomer Composition H

An imide oligomer composition H (imidization ratio: 91%) was obtained as in Synthesis Example 4 except that the amount of 4,4'-(4,4'-isopropylidenediphenoxy)diphthalic anhydride added was changed to 78.1 parts by weight.

$^1$H-NMR, GPC, and FT-IR analyses showed that the imide oligomer composition H contained an imide oligomer having a structure of the above formula (1-1) (A is a group of the above formula (17) and B is a group of the above formula (14)). The imide oligomer having a structure of the formula (1-1) had a number average molecular weight of 4,200.

SYNTHESIS EXAMPLE 9

Preparation of Imide Oligomer Composition I

An imide oligomer composition I (imidization ratio: 90%) was obtained as in Synthesis Example 1 except that 62.0 parts by weight of 3,4'-oxydiphthalic dianhydride was changed to 52.0 parts by weight of 4,4'-(4,4'-isopropylidene-diphenoxy)diphthalic anhydride (available from Tokyo Chemical Industry Co., Ltd.), and that 34.5 parts by weight of 1,3-bis(2-(4-aminophenyl)-2-propyl)benzene was changed to 12.4 parts by weight of 1,3-bis(3-aminopropyl)tetramethyldisiloxane (available from Tokyo Chemical Industry Co., Ltd.).

$^1$H-NMR, GPC, and FT-IR analyses showed that the imide oligomer composition I contained an imide oligomer having a siloxane skeleton and an acid anhydride group at an end. The imide oligomer had a number average molecular weight of 1,880.

Synthesis Example 10

Preparation of Imide Oligomer Composition J

An amount of 24.6 parts by weight of 5-amino-o-cresol was dissolved in 400 parts by weight of N-methylpyrrolidone (available from Wako Pure Chemical Industries, Ltd., "NMP"). To the obtained solution was added 31.0 parts by weight of 3,4'-oxydiphthalic dianhydride (available from Tokyo Chemical Industry Co., Ltd., "3,4'-ODPA"), followed by stirring at 25° C. for two hours to cause reaction to give an amic acid oligomer solution. N-Methylpyrrolidone was removed from the obtained amic acid oligomer solution under reduced pressure, followed by heating at 300° C. for two hours to give an imide oligomer composition J (imidization ratio: 91%).

¹H-NMR, GPC, and FT-IR analyses showed that the imide oligomer composition J contained an imide oligomer having a structure of the above formula (1-2) (A is a group of the above formula (13) and Ar is a group of the following formula (18)). The imide oligomer having a structure of the formula (1-2) had a number average molecular weight of 650. The analyses further showed that the imide oligomer composition J contained an imide oligomer of the above formula (5-1) (A is a group of the above formula (13) and R is a methyl group) as the imide oligomer having a structure of the formula (1-2).

[Chem. 18]

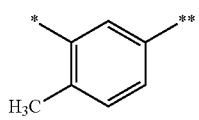

(18)

In the formula (18), * and ** are each a binding site, and * is a binding site to the hydroxy group in the formula (1-2).

SYNTHESIS EXAMPLE 11

Preparation of Imide Oligomer Composition K

An imide oligomer composition K (imidization ratio: 90%) was obtained as in Synthesis Example 10 except that 24.6 parts by weight of 5-amino-o-cresol was changed to 21.8 parts by weight of 3-aminophenol.

¹H-NMR, GPC, and FT-IR analyses showed that the imide oligomer composition K contained an imide oligomer having a structure of the above formula (1-2) (A is a group of the above formula (13) and Ar is a group of the following formula (19)). The imide oligomer having a structure of the formula (1-2) had a number average molecular weight of 630. The analyses further showed that the imide oligomer composition K contained an imide oligomer of the above formula (5-1) (A is a group of the above formula (13) and R is a hydrogen atom) as the imide oligomer having a structure of the formula (1-2).

[Chem. 19]

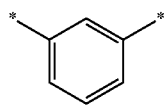

(19)

In the formula (19), * is a binding site.

SYNTHESIS EXAMPLE 12

Peparation of Imide Oligomer Composition L

An imide oligomer composition L (imidization ratio: 92%) was obtained as in Synthesis Example 10 except that 31.0 parts by weight of 3,4'-oxydiphthalic dianhydride was changed to 52.0 parts by weight of 4,4'-(4,4'-isopropylidenediphenoxy)diphthalic anhydride.

¹H-NMR, GPC, and FT-IR analyses showed that the imide oligomer composition L contained an imide oligomer having a structure of the above formula (1-2) (A is a group of the above formula (17) and Ar is a group of the above formula (18)). The imide oligomer having a structure of the formula (1-2) had a number average molecular weight of 910. The analyses further showed that the imide oligomer composition L contained an imide oligomer of the above formula (5-1) (A is a group of the above formula (17) and R is a methyl group) as the imide oligomer having a structure of the formula (1-2).

SYNTHESIS EXAMPLE 13

Preparation of Imide Oligomer Composition M

An imide oligomer composition M (imidization ratio: 91%) was obtained as in Synthesis Example 10 except that 31.0 parts by weight of 3,4'-oxydiphthalic dianhydride was changed to 135.0 parts by weight of the imide oligomer composition E obtained in Synthesis Example 5.

¹H-NMR, GPC, and FT-IR analyses showed that the imide oligomer composition M contained an imide oligomer having a structure of the above formula (1-2) (A is a group of the above formula (17) and Ar is a group of the above formula (18). The imide oligomer having a structure of the formula (1-2) had a number average molecular weight of 2,960. The analyses further showed that the imide oligomer composition M contained an imide oligomer of the above formula (5-3) (A is a group of the above formula (17), B is a group of the above formula (14), and R is a methyl group) as the imide oligomer having a structure of the formula (1-2).

SYNTHESIS EXAMPLE 14

Preparation of Imide Oligomer Composition N

An imide oligomer composition N (imidization ratio: 91%) was obtained as in Synthesis Example 10 except that the amount of 5-amino-o-cresol added was changed to 25.9 parts by weight.

¹H-NMR, GPC, and FT-IR analyses showed that the imide oligomer composition N contained an imide oligomer having a structure of the above formula (1-2) (A is a group of the above formula (13) and Ar is a group of the above formula (18)). The imide oligomer having a structure of the formula (1-2) had a number average molecular weight of 590. The analyses further showed that the imide oligomer composition N contained an imide oligomer of the above formula (5-1) (A is a group of the above formula (13) and R is a methyl group) as the imide oligomer having a structure of the formula (1-2).

SYNTHESIS EXAMPLE 15

Preparation of Imide Oligomer Composition O

An amount of 24.6 parts by weight of 5-amino-o-cresol was dissolved in 400 parts by weight of N-methylpyrrolidone (available from Wako Pure Chemical Industries, Ltd., "NMP"). To the obtained solution was added 31.0 parts by weight of 3,4'-oxydiphthalic dianhydride (available from Tokyo Chemical Industry Co., Ltd., "3,4'-ODPA"), followed by stirring at 25° C. for two hours to cause reaction to give an amic acid oligomer solution. The amic acid oligomer solution was heated at 180° C. for three hours in N-methylpyrrolidone while removing with a Dean-Stark tube the water generated from imidization, and then N-methylpyrrolidone was removed under reduced pressure. Thus, an imide oligomer composition 0 (imidization ratio: 25%) was obtained.

$^1$H-NMR, GPC, and FT-IR analyses showed that the imide oligomer composition 0 contained an imide oligomer having a structure of the above formula (1-2) (A is a group of the above formula (13) and Ar is a group of the above formula (18)). The imide oligomer having a structure of the formula (1-2) had a number average molecular weight of 680. The analyses further showed that the imide oligomer composition 0 contained an imide oligomer of the above formula (5-1) (A is a group of the above formula (13) and R is a methyl group) as the imide oligomer having a structure of the formula (1-2).

SYNTHESIS EXAMPLE 16

Preparation of Imide Oligomer Composition P

An imide oligomer composition P (imidization ratio: 90%) was obtained as in Synthesis Example 10 except that 31.0 parts by weight of 3,4'-oxydiphthalic dianhydride was changed to 180.0 parts by weight of the imide oligomer composition H obtained in Synthesis Example 8.

$^1$H-NMR, GPC, and FT-IR analyses showed that the imide oligomer composition P contained an imide oligomer having a structure of the above formula (1-2) (A is a group of the above formula (17) and Ar is a group of the above formula (18)). The imide oligomer having a structure of the formula (1-2) had a number average molecular weight of 4,610.

(Solubility)

Each of the imide oligomer compositions obtained in the synthesis examples was dissolved in methyl ethyl ketone (MEK), tetrahydrofuran (THF), and a bisphenol F epoxy resin (available from DIC Corporation, "EPICLON EXA-830CRP"). The solubility was evaluated as "Good (o)" when the amount of the imide oligomer composition dissolved in the MEK, THF, and bisphenol F epoxy resin, 10 g each, was 3 g or more, "Fair (Δ)" when the amount was 1 g or more and less than 3 g, and "Poor (×)" when the amount was less than 1 g.

For the MEK and THF, a predetermined amount of the imide oligomer composition was added to 10 g of the MEK or THF, followed by stirring using a planetary stirrer. The solubility at 25° C. was then evaluated. For EXA-830CRP, a predetermined amount of the imide oligomer composition was added to 10 g of EXA-830CRP, followed by stirring for one hour with heating at 150° C., then followed by cooling. The solubility at 25° C. was then evaluated.

Table 1 shows the results.

(Melting Point)

The melting point of each of the imide oligomer compositions obtained in the synthesis examples was measured as the endothermic peak temperature using a differential scanning calorimeter (EXTEAR DSC6100 (available from SII NanoTechnology Inc.) at a temperature increase rate of 10° C./min.

Table 1 shows the results.

TABLE 1

| | | Imide oligomer composition | | | | | | | | |
|---|---|---|---|---|---|---|---|---|---|---|
| | | A | B | C | D | E | F | G | H | I |
| Solubility | MEK (Boiling point 80° C.) | o | o | Δ | o | Δ | o | o | × | o |
| | THF (Boiling point 66° C.) | o | o | o | o | o | o | o | Δ | o |
| | EXA-830CRP | o | o | o | o | o | o | o | × | Δ |
| Melting point (° C.) | | 157 | 167 | 140 | 138 | 138 | 152 | 147 | 143 | 58 |

| | | Imide oligomer composition | | | | | | |
|---|---|---|---|---|---|---|---|---|
| | | J | K | L | M | N | O | P |
| Solubility | MEK (Boiling point 80° C.) | o | o | o | Δ | o | o | × |
| | THF (Boiling point 66° C.) | o | o | o | o | o | o | × |
| | EXA-830CRP | o | o | o | Δ | o | o | × |
| Melting point (° C.) | | 160 | 149 | 140 | 183 | 155 | 150 | 193 |

EXAMPLES 1 to 16 AND COMPARATIVE EXAMPLES 1 to 5

Curable resin compositions of Examples 1 to 16 and Comparative Examples 1 to 5 were prepared by mixing materials according to the formulations shown in Tables 2 to 5.

Each obtained curable resin composition was applied to a substrate PET film to a thickness of about 20 μm and dried to give a curable resin composition film.

The PET film was removed from the obtained curable resin composition film. Polyimide films (available from Du Pont-Toray Co., Ltd., "Kapton 200H") each having a thickness of 50 μm were bonded to both surfaces of the adhesive layer using a laminator with heating at 80° C. The laminate was hot pressed under the conditions of 190° C., 3 MPa, and one hour to cure the adhesive layer, and then cut to a specimen having a width of 1 cm. The initial adhesive force of the specimen within 24 hours after the preparation was measured by a T-peel test at 25° C. at a peeling speed of 20 mm/min using a tensile tester (available from Orientec Co., Ltd., "UCT-500"). Separately, a specimen prepared in the same manner was stored at 200° C. for 100 hours and then cooled to 25° C. The adhesive force of the specimen within 24 hours after the cooling was measured in the same method as the initial adhesive force.

Furthermore, a specimen prepared in the same manner was stored in an environment at 85° C. and 85% RH for 24 hours and then cooled to 25° C. The adhesive force of the specimen within 24 hours after the cooling was measured in the same method as the initial adhesive force.

The tack value at 25° C. and the tack value at 60° C. of each curable resin composition film were measured at the side opposite to the substrate film side. The tack values were measured with a probe tack measuring device (Tackiness Tester TAC-2 (available from RHESCA Co., LTD.)) under the measurement conditions of a probe diameter of 5 mm, a contact speed of 0.5 mm/sec, a test speed of 0.5 mm/sec, a contact load of 0.05 MPa, a contact time of 1 second, and a measurement temperature of 25° C. and 60° C.

The surface free energy of each obtained curable resin composition film was measured using the side opposite to the substrate film side. The surface free energy was calculated by the above formulae based on the measurement of the contact angle (drop volume: 3 μL, 30 seconds after dropping) with water and methylene iodide using a contact angle meter.

Tables 2 to 5 show the obtained measurement results of the initial adhesive force, the adhesive force after storage at 200° C. for 100 hours, the adhesive force after storage at 85° C. and 85% RH for 24 hours, the tack value at 25° C., the tack value at 60° C., and the surface free energy.

<Evaluation>

The curable resin compositions obtained in the examples and the comparative examples were evaluated as follows. Tables 2 to 5 show the results.

(Weight Reduction Ratio at 330° C.)

Each of the curable resin compositions obtained in the examples and the comparative examples was applied to a substrate film and dried to give a curable resin composition film.

The weight reduction ratio (%) at 330° C. of the curable resin composition film was measured using a device for thermogravimetry (available from SII NanoTechnology Inc., "EXTEAR TG/DTA6200") by increasing the temperature from 30° C. to 400° C. at 10° C./min.

(Glass Transition Temperature)

Each of the curable resin compositions obtained in the examples and the comparative examples was applied to a substrate film and dried to give a curable resin composition film. Curable resin composition films obtained in this manner were stacked and heated at 190° C. for 30 minutes to be cured, whereby a cured product having a thickness of 400 μm was obtained. The glass transition temperature of the obtained cured product was determined as the peak temperature on a tan δ curve obtained when the temperature was increased from 0° C. to 300° C. using a dynamic viscoelasticity measuring apparatus (available from A & D Company, Limited, "RHEOVIBRON DDV-25GP") at a temperature increase rate of 10° C./min, a frequency of 10 Hz, and a chuck interval of 24 mm. A glass transition temperature of 150° C. or higher was evaluated as "Good (o)". A glass transition temperature of 130° C. or higher and lower than 150° C. was evaluated as "Fair (Δ)". A glass transition temperature of lower than 130° C. was evaluated as "Poor (×)".

(Long-Term Heat Resistance)

Each of the curable resin compositions obtained in the examples and the comparative examples was applied to a substrate film and dried to give a curable resin composition film. Polyimide films (available from Du Pont-Toray Co., Ltd., "Kapton V") each having a thickness of 20 μm were stacked on both surfaces of the obtained curable resin composition film (thickness: 20 μm) and heated at 190° C. for one hour to be cured, followed by heating at 175° C. for 1,000 hours. The laminate of the curable resin composition film and the polyimide films after the heat treatment was placed in an arch shape along a cylinder having a diameter of 5 mm or 3 mm at room temperature. The state of the laminate of the curable resin composition film and the polyimide films was then visually observed.

The long-term heat resistance was evaluated as "Good (o)" in the case where no crack or fracture was observed at all when the laminate was placed in an arch shape along the cylinder having a diameter of 3 mm, "Fair (Δ)" in the case where no crack or fracture was observed when the laminate was placed in an arch shape along the cylinder having a diameter of 5 mm, but a crack or a fracture was observed when it was placed in an arch shape along the cylinder having a diameter of 3 mm, and "Poor (x)" in the case where a crack or fracture was observed when the laminate was placed in an arch shape along the cylinder having a diameter of 5 mm.

TABLE 2

|  |  |  | Examples | | | | | | |
| --- | --- | --- | --- | --- | --- | --- | --- | --- | --- |
|  |  |  | 1 | 2 | 3 | 4 | 5 | 6 | 7 |
| Composition (parts by weight) | Curable resin | Bisphenol F epoxy resin (available from DIC Corporation, "EPICLON EXA-830CRP", liquid at 25° C.) | 100 | 100 | 100 | 100 | 100 | 100 | 100 |
|  | Curing agent | Imide oligomer composition A (imidizaion ratio 92%, containing an oligomer having a structure of formula (1-1) and a number average molecular weight of 1380) | 145 | — | — | — | — | — | — |
|  |  | Imide oligomer composition B (imidizaion ratio 92%, containing an oligomer having a structure of formula (1-1) and a number average molecular weight of 1390) | — | 145 | — | — | — | — | — |

TABLE 2-continued

|  |  |  | Examples | | | | | | |
|---|---|---|---|---|---|---|---|---|---|
|  |  |  | 1 | 2 | 3 | 4 | 5 | 6 | 7 |
|  |  | Imide oligomer composition C (imidizaion ratio 91%, containing an oligomer having a structure of formula (1-1) and a number average molecular weight of 1310) | — | — | 137 | — | — | — | — |
|  |  | Imide oligomer composition D (imidizaion ratio 93%, containing an oligomer having a structure of formula (1-1) and a number average molecular weight of 2020) | — | — | — | 211 | — | — | — |
|  |  | Imide oligomer composition E (imidizaion ratio 91%, containing an oligomer having a structure of formula (1-1) and a number average molecular weight of 2520) | — | — | — | — | 222 | — | — |
|  |  | Imide oligomer composition F (imidizaion ratio 92%, containing an oligomer having a structure of formula (1-1) and a number average molecular weight of 1220) | — | — | — | — | — | 132 | — |
|  |  | Imide oligomer composition G (imidizaion ratio 23%, containing an oligomer having a structure of formula (1-1) and a number average molecular weight of 1400) | — | — | — | — | — | — | 145 |
|  | Curing accelerator | 2,4-Diamino-6-(2'-methylimidazolyl-(1'))-ethyl-s-triazine (available from Shikoku Chemicals Corporation, "2MZ-A", melting point 248° C. to 258° C.) | 5 | 5 | 5 | 5 | 5 | 5 | 5 |
|  | Organic filler | Polyimide particles (available from Ube Industries, Ltd., "UIP-S") | — | — | — | — | — | — | — |
|  | Fluidity modifier | Hydrophobic fumed silica (available from Tokuyama Corporation, "MT-10") | 5 | 5 | 5 | 5 | 5 | 5 | 5 |
|  | Solvent | Methyl ethyl ketone (available from Wako Pure Chemical Industries, Ltd., "MEK") | 300 | 300 | 300 | 300 | 300 | 300 | 300 |
| Initial adhesive force (N/cm) | | | 8.6 | 9.5 | 9.8 | 7.8 | 8.6 | 9.0 | 5.5 |
| Adhesive force (N/cm) after storage at 200° C. for 100 hours | | | 7.2 | 9.0 | 8.6 | 7.0 | 8.3 | 8.6 | 4.5 |
| (Adhesive force after storage at 200° C. for 100 hours)/(Initial adhesive force) | | | 0.84 | 0.95 | 0.88 | 0.90 | 0.97 | 0.96 | 0.82 |
| Adhesive force (N/cm) after storage at 85° C. and 85% RH for 24 hours | | | 8.4 | 9.0 | 9.2 | 7.7 | 8.5 | 8.4 | 4.4 |
| (Adhesive force after storage at 85° C. and 85% RH for 24 hours)/(Initial adhesive force) | | | 0.98 | 0.95 | 0.94 | 0.99 | 0.99 | 0.93 | 0.80 |
| Tack value at 25° C. (gf/5 mmφ) | | | 7.8 | 5.4 | 8.6 | 9.2 | 3.8 | 6.8 | 10.5 |
| Tack value at 60° C. (gf/5 mmφ) | | | 35.8 | 19.2 | 23.4 | 23 | 12.7 | 15.2 | 25.6 |
| (Tack value at 60° C.)/(Tack value at 25° C.) | | | 4.6 | 3.6 | 2.7 | 2.5 | 3.3 | 2.2 | 2.4 |
| Surcace free energy (mJ/m$^2$) | | | 47.3 | 50.5 | 47.9 | 46.5 | 41.5 | 42.1 | 54.5 |
| Evaluation | Weight reduction ratio at 330° C. (%) | | 1.4 | 1.4 | 1.5 | 1.2 | 1.4 | 1.5 | 2.0 |
|  | Glass transition temperature | | ○ | ○ | ○ | ○ | ○ | ○ | ○ |
|  | Long-term heat resistance (175° C., 1000 hours) | | ○ | ○ | ○ | ○ | ○ | ○ | Δ |

TABLE 3

|  |  |  | Examples | | | | | |
|---|---|---|---|---|---|---|---|---|
|  |  |  | 8 | 9 | 10 | 11 | 12 | 13 |
| Composition (parts by weight) | Curable resin | Bisphenol F epoxy resin (available from DIC Corporation, "EPICLON EXA-830CRP", liquid at 25° C.) | 100 | 100 | 100 | 100 | 100 | 100 |
|  | Curing agent | Imide oligomer composition J (imidizaion ratio 91%, containing an oligomer having a structure of formula (1-2) and a number average molecular weight of 650) | 163 | — | — | — | — | — |
|  |  | Imide oligomer composition K (imidizaion ratio 90%, containing an oligomer having a structure of formula (1-2) and a number average molecular weight of 630) | — | 154 | — | — | — | — |

TABLE 3-continued

|  |  |  | Examples | | | | | |
|---|---|---|---|---|---|---|---|---|
|  |  |  | 8 | 9 | 10 | 11 | 12 | 13 |
|  |  | Imide oligomer composition L (imidizaion ratio 92%, containing an oligomer having a structure of formula (1-2) and a number average molecular weight of 910) | — | — | 228 | — | — | — |
|  |  | Imide oligomer composition M (imidizaion ratio 91%, containing an oligomer having a structure of formula (1-2) and a number average molecular weight of 2960) | — | — | — | 487 | — | — |
|  |  | Imide oligomer composition N (imidizaion ratio 91%, containing an oligomer having a structure of formula (1-2) and a number average molecular weight of 590) | — | — | — | — | 148 | — |
|  |  | Imide oligomer composition O (imidizaion ratio 25%, containing an oligomer having a structure of formula (1-2) and a number average molecular weight of 680) | — | — | — | — | — | 163 |
|  | Curing accelerator | 2,4-Diamino-6-(2'-methylimidazolyl-(1'))-ethyl-s-triazine (available from Shikoku Chemicals Corporation, "2MZ-A", melting point 248° C. to 258° C.) | 5 | 5 | 5 | 5 | 5 | 5 |
|  | Organic filler | Polyimide particles (available from Ube Industries, Ltd., "UIP-S") | — | — | — | — | — | — |
|  | Fluidity modifier | Hydrophobic fumed silica (available from Tokuyama Corporation, "MT-10") | 5 | 5 | 5 | 5 | 5 | 5 |
|  | Solvent | Methyl ethyl ketone (available from Wako Pure Chemical Industries, Ltd., "MEK") | 300 | 300 | 300 | 300 | 300 | 300 |
| Initial adhesive force (N/cm) |  |  | 5.0 | 5.9 | 4.9 | 6.5 | 5.8 | 4.0 |
| Adhesive force (N/cm) after storage at 200° C. for 100 hours |  |  | 4.8 | 5.1 | 4.6 | 5.4 | 5.0 | 3.3 |
| (Adhesive force after storage at 200° C. for 100 hours)/(Initial adhesive force) |  |  | 0.96 | 0.86 | 0.94 | 0.83 | 0.86 | 0.83 |
| Adhesive force (N/cm) after storage at 85° C. and 85% RH for 24 hours |  |  | 4.5 | 5.4 | 4.5 | 6.4 | 5.0 | 3.3 |
| (Adhesive force after storage at 85° C. and 85% RH for 24 hours)/(Initial adhesive force) |  |  | 0.90 | 0.92 | 0.92 | 0.98 | 0.86 | 0.83 |
| Tack value at 25° C. (gf/5 mmφ) |  |  | 6.9 | 7.6 | 8.5 | 4.5 | 5.9 | 9.5 |
| Tack value at 60° C. (gf/5 mmφ) |  |  | 28.2 | 26.8 | 21.6 | 12.4 | 31.5 | 19.5 |
| (Tack value at 60° C.)/(Tack value at 25° C.) |  |  | 4.1 | 3.5 | 2.5 | 2.8 | 5.3 | 2.1 |
| Surcace free energy (mJ/m$^2$) |  |  | 46.5 | 42.5 | 47.8 | 48.5 | 45.0 | 52.0 |
| Evaluation | Weight reduction ratio at 330° C. (%) |  | 1.5 | 1.6 | 1.4 | 1.9 | 1.6 | 2.0 |
|  | Glass transition temperature |  | ○ | ○ | ○ | ○ | ○ | ○ |
|  | Long-term heat resistance (175° C., 1000 hours) |  | ○ | ○ | ○ | Δ | ○ | Δ |

TABLE 4

|  |  |  | Examples | | |
|---|---|---|---|---|---|
|  |  |  | 14 | 15 | 16 |
| Composition (parts by weight) | Curable resin | Bisphenol A epoxy resin (available from DIC Corporation, "EPICLON EXA-850CRP", liquid at 25° C.) | 100 | — | — |
|  |  | Resorcinol epoxy resin (available from Nagase ChemteX Corporation, "DENACOL EX-201P", liquid at 25° C.) | — | 100 | — |
|  |  | Phenol novolac epoxy resin (available from The Dow Chemical Company, "D.E.N. 431", semisolid at 25° C.) | — | — | 100 |
|  | Curing agent | Imide oligomer composition A (imidizaion ratio 92%, containing an oligomer having a structure of formula (1-1) and a number average molecular weight of 1380) | 136 | 232 | 133 |

TABLE 4-continued

|  |  |  | Examples | | |
|---|---|---|---|---|---|
|  |  |  | 14 | 15 | 16 |
|  | Curing accelerator | 2,4-Diamino-6-(2'-methylimidazolyl-(1'))-ethyl-s-triazine (available from Shikoku Chemicals Corporation, "2MZ-A", melting point 248° C. to 258° C.) | 5 | 5 | 5 |
|  | Organic filler | Polyimide particles (available from Ube Industries, Ltd., "UIP-S") | — | — | — |
|  | Fluidity modifier | Hydrophobic fumed silica (available from Tokuyama Corporation, "MT-10") | 5 | 5 | 5 |
|  | Solvent | Methyl ethyl ketone (available from Wako Pure Chemical Industries, Ltd., "MEK") | 300 | 300 | 300 |
| Initial adhesive force (N/cm) | | | 8.5 | 7.9 | 7.0 |
| Adhesive force (N/cm) after storage at 200° C. for 100 hours | | | 7.7 | 7.6 | 6.8 |
| (Adhesive force after storage at 200° C. for 100 hours)/(Initial adhesive force) | | | 0.91 | 0.96 | 0.97 |
| Adhesive force (N/cm) after storage at 85° C. and 85% RH for 24 hours | | | 8.4 | 7.4 | 6.5 |
| (Adhesive force after storage at 85° C. and 85% RH for 24 hours)/(Initial adhesive force) | | | 0.99 | 0.94 | 0.93 |
| Tack value at 25° C. (gf/5 mmφ) | | | 6.8 | 8.6 | 2.5 |
| Tack value at 60° C. (gf/5 mmφ) | | | 46.5 | 28.5 | 19.2 |
| (Tack value at 60° C.)/(Tack value at 25° C.) | | | 6.8 | 3.3 | 7.7 |
| Surcace free energy (mJ/m$^2$) | | | 47.2 | 48.6 | 45.7 |
| Evaluation | Weight reduction ratio at 330° C. (%) | | 1.4 | 1.3 | 1.4 |
|  | Glass transition temperature | | ○ | ○ | ○ |
|  | Long-term heat resistance (175° C., 1000 hours) | | ○ | ○ | ○ |

TABLE 5

|  |  |  | Comparative Examples | | | | |
|---|---|---|---|---|---|---|---|
|  |  |  | 1 | 2 | 3 | 4 | 5 |
| Composition (parts by weight) | Curable resin | Bisphenol F epoxy resin (available from DIC Corporation, "EPICLON EXA-830CRP") | 100 | 100 | 100 | 100 | 100 |
|  | Curing agent | Imide oligomer composition H (imidizaion ratio 91%, containing an oligomer having a structure of formula (1-1) and a number average molecular weight of 4200) | 281 | — | — | — | — |
|  |  | Imide oligomer composition P (imidizaion ratio 90%, containing an oligomer having a structure of formula (1-2) and a number average molecular weight of 4610) | — | 649 | — | — | — |
|  |  | Imide oligomer composition I (imidization ratio 90%, containing an oligomer having a siloxane skeleton and a number average molecular weight of 1880) | — | — | 157 | — | — |
|  |  | Trialkyltetrahydrophthalic anhydride (available from Mitsubishi Chemical Corporation, "YH-306") | — | — | — | 73 | — |
|  |  | Diallylbisphenol A (available from Meiwa Plastic Industries, Ltd., "MEH-8000H") | — | — | — | — | 87 |
|  | Curing accelerator | 2,4-Diamino-6-(2'-methylimidazolyl-(1'))-ethyl-s-triazine (available from Shikoku Chemicals Corporation, "2MZ-A", melting point 248° C. to 258° C.) | 5 | 5 | 5 | 5 | 5 |
|  | Organic filler | Polyimide particles (available from Ube Industries, Ltd., "UIP-S") | — | — | — | — | — |
|  | Fluidity modifier | Hydrophobic fumed silica (available from Tokuyama Corporation, "MT-10") | 5 | 5 | 5 | 5 | 5 |

TABLE 5-continued

| | | Comparative Examples | | | | |
|---|---|---|---|---|---|---|
| | | 1 | 2 | 3 | 4 | 5 |
| Solvent | Methyl ethyl ketone (available from Wako Pure Chemical Industries, Ltd., "MEK") | 300 | 300 | 300 | 300 | 300 |
| Initial adhesive force (N/cm) | | 3.0 | 3.3 | 6.7 | 6.5 | 6 |
| Adhesive force (N/cm) after storage at 200° C. for 100 hours | | 2.5 | 2.0 | 2.8 | 4.2 | 1.5 |
| (Adhesive force after storage at 200° C. for 100 hours)/(Initial adhesive force) | | 0.83 | 0.61 | 0.42 | 0.65 | 0.25 |
| Adhesive force (N/cm) after storage at 85° C. and 85% RH for 24 hours | | 2.5 | 2.8 | 6.0 | 2.5 | 1 |
| (Adhesive force after storage at 85° C. and 85% RH for 24 hours)/(Initial adhesive force) | | 0.83 | 0.85 | 0.90 | 0.38 | 0.17 |
| Tack value at 25° C. (gf/5 mmφ) | | 5.5 | 4.9 | 3.5 | 13.5 | 31.5 |
| Tack value at 60° C. (gf/5 mmφ) | | 8.5 | 6.7 | 7.0 | 26.8 | 40.8 |
| (Tack value at 60° C.)/(Tack value at 25° C.) | | 1.5 | 1.4 | 2.0 | 2.0 | 1.3 |
| Surcace free energy (mJ/m$^2$) | | 45.5 | 41.9 | 34.5 | 40.6 | 34.0 |
| Evaluation | Weight reduction ratio at 330° C. (%) | 2.5 | 2.8 | 1.7 | 3.0 | 1.5 |
| | Glass transition temperature | ○ | ○ | x | ○ | x |
| | Long-term heat resistance (175° C., 1000 hours) | x | x | x | x | x |

INDUSTRIAL APPLICABILITY

The present invention can provide a curable resin composition capable of providing a cured product that has a high glass transition temperature after curing and is excellent in thermal decomposition resistance, adhesiveness, and long-term heat resistance. The present invention also can provide a cured product of the curable resin composition, an adhesive containing the curable resin composition, and an adhesive film, a coverlay film, a flexible copper clad laminate, and a circuit board each formed using the curable resin composition.

The invention claimed is:

1. A curable resin composition comprising:
a curable resin;
an imide oligomer composition containing an imide oligomer having an imide skeleton in a main chain and a crosslinkable functional group at an end and having a number average molecular weight of 4,000 or less; and
a curing accelerator,
a cured product of the curable resin composition having an initial adhesive force to polyimide of 3.4 N/cm or more,
the cured product after storage at 200° C. for 100 hours having an adhesive force to polyimide of at least 0.8 times the initial adhesive force,
wherein the imide oligomer composition has an imidization ratio of 70% or more and 98% or less, and
the imide oligomer is an imide oligomer containing no siloxane skeleton in its structure and contains a structure of the following formula (1-1):

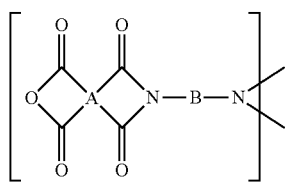

(1-1)

wherein, A is a tetravalent group of the following formula (2-1) or the following formula (2-2); and B is a divalent group of the following formula (14), the following formula (15), or the following formula (16),

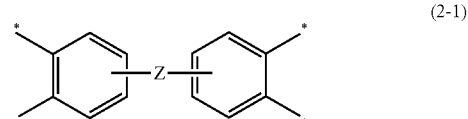

(2-1)

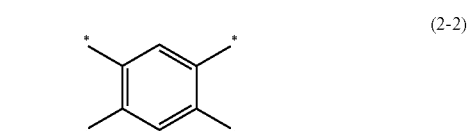

(2-2)

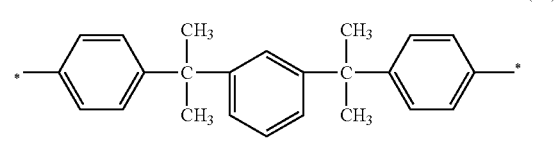

(14)

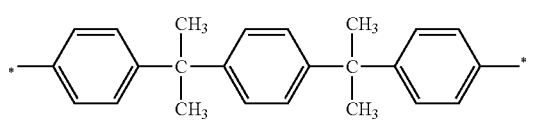

(15)

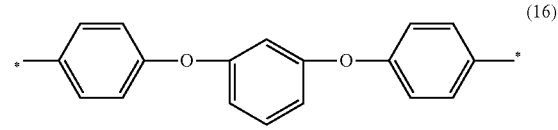

(16)

wherein, in the formula (2-1), the formula (2-2), the formula (14), the formula (15), and the formula (16), * is a binding site; in the formula (2-1), Z is a bond, an oxygen atom, or a substituted or unsubstituted divalent hydrocarbon group that may have an oxygen atom at a binding site; and in the formula (2-1) and the formula (2-2), a hydrogen atom of an aromatic ring may be replaced.

2. The curable resin composition according to claim 1, which contains the imide oligomer in an amount of 20% by weight or more and 80% by weight or less relative to the total weight of the curable resin, the imide oligomer, and the curing accelerator.

3. The curable resin composition according to claim 1, wherein the curable resin is liquid at 25° C.

4. The curable resin composition according to claim 1, wherein the curable resin contains an epoxy resin.

5. The curable resin composition according to claim 1, wherein the crosslinkable functional group is a functional group capable of reacting with an epoxy group.

6. The curable resin composition according to claim 1, which contains the curing accelerator in an amount of 0.8% by weight or more relative to the total weight of the curable resin, the imide oligomer, and the curing accelerator.

7. The curable resin composition according to claim 1, wherein
the curable resin composition has a tack value at 60° C. of at least 2 times the tack value at 25° C.

8. The curable resin composition according to claim 1, wherein
the curable resin composition has a surface free energy of 40 mJ/m$^2$ or more.

9. The curable resin composition according to claim 1, wherein the cured product after storage in an environment at 85° C. and 85% RH for 24 hours has an adhesive force to polyimide of at least 0.8 times the initial adhesive force.

10. The curable resin composition according to claim 7, wherein the curable resin is liquid at 25° C.

11. The curable resin composition according to claim 7, wherein the curable resin contains at least one selected from the group consisting of an epoxy resin, a phenolic resin, a silicone resin, a fluororesin, a polyimide resin, a maleimide resin, and a benzoxazine resin.

12. The curable resin composition according to claim 1, comprising a nonpolar solvent having a boiling point of 120° C. or lower or an aprotic polar solvent having a boiling point of 120° C. or lower.

13. A cured product of the curable resin composition according to claim 1.

14. The cured product according to claim 13, which has a weight reduction ratio at 330° C. of less than 2.5%.

15. The cured product according to claim 13, which has a glass transition temperature of 150° C. or higher.

16. An adhesive comprising
the curable resin composition according to claim 1.

17. An adhesive film comprising
the curable resin composition according to claim 1.

18. A coverlay film comprising:
a substrate film; and
a layer containing the curable resin composition according to claim 1 formed on the substrate film.

19. A flexible copper clad laminate comprising:
a substrate film;
a layer containing the curable resin composition according to claim 1 formed on the substrate film; and
copper foil.

20. A circuit board comprising:
the cured product according to claim 13.

* * * * *